United States Patent [19]

Igeta

[11] Patent Number: 5,327,009
[45] Date of Patent: Jul. 5, 1994

[54] MINIATURIZED INTEGRATED CIRCUIT PACKAGE

[75] Inventor: Masahiko Igeta, Kanagawa, Japan

[73] Assignee: NEC Corporation, Tokyo, Japan

[21] Appl. No.: 64,980

[22] Filed: May 24, 1993

[30] Foreign Application Priority Data

May 22, 1992 [JP] Japan .................................. 4-130319

[51] Int. Cl.$^5$ ...................... H01L 23/48; H01L 29/44; H01L 29/52; H01L 29/60
[52] U.S. Cl. .................................... 257/666; 257/676
[58] Field of Search ............... 257/666, 667, 668, 669, 257/670, 671, 672, 673, 674, 675, 676

[56] References Cited

U.S. PATENT DOCUMENTS

| | | | |
|---|---|---|---|
| 4,825,280 | 4/1989 | Chen et al. | 257/659 |
| 4,862,245 | 8/1989 | Pashby et al. | 357/70 |
| 5,072,280 | 12/1991 | Matsukura | 257/676 |
| 5,233,221 | 8/1993 | Bregman et al. | 257/673 |

FOREIGN PATENT DOCUMENTS

| | | | |
|---|---|---|---|
| 55-12791 | 1/1980 | Japan | 257/666 |
| 1-123427 | 5/1989 | Japan | 257/666 |
| 3-256352 | 11/1991 | Japan | 257/676 |

OTHER PUBLICATIONS

W. Ward, "Volume Production of Unique . . . IBM 80-ns 1-Mbit DRAM Chip by Area Wire Bond Techniques", Proceedings of the 38th Electronic Component Conference, XIII-4, May, 1988, pp. 552-557.

Primary Examiner—Rolf Hille
Assistant Examiner—S. V. Clark
Attorney, Agent, or Firm—Sughrue, Mion, Zinn, Macpeak & Seas

[57] ABSTRACT

A high density integrated circuit package is provided whose miniaturization is performed by positioning inner end portions of lead fingers extending externally of the package inside a peripheral portion of a rectangular semiconductor chip. Bonding terminals on the rectangular semiconductor chip are arranged along one of long sides thereof, a plurality of lead fingers are arranged in a direction perpendicular to the long side and the inner end portions of the lead fingers are arranged in the vicinity of the arrangement of the chip terminals, so that distance between the chip terminals and the inner end portions of the lead fingers is shortened and length of thin metal wires connecting the chip terminals and the inner end portions of the lead fingers is reduced.

6 Claims, 2 Drawing Sheets

MINIATURIZED INTEGRATED CIRCUIT PACKAGE

BACKGROUND OF THE INVENTION

1. Field of the Invention

The present invention relates to a package for encapsulating a semiconductor integrated circuit (IC) and, more particularly, to an improvement in package for a dynamic random access memory (DRAM) having a large memory capacity.

2. Description of the Prior Art

With increase of integration density of an IC, a chip area is increased. For example, a DRAM of 1 M-bit has at least 5 mm wide and at least 10 mm long. Although the increase in chip area of a DRAM is being suppressed by improving the miniaturization technology, it would be unavoidable that the chip area is made large with the memory capacity being increased to 4 M-bit, 16 M-bit and so forth.

For an IC such as 256 K-bit DRAM which has an intermediary integration density and an intermediary chip area, a plurality of chip terminals, that is, wire bonding pads, formed on a chip are generally arranged linearly along peripheral edges of the chip (in general, along a pair of long sides of the rectangular chip). The chip is mounted on a chip mounting portion of a lead frame which has a plurality of leads extending radially from the chip mounting portion. The chip terminals and inner end portions of the respective leads are connected through thin gold wires (i.e., bonding wires), respectively. The above-mentioned positional relation among the chip, the leads and the bonding wires is similar to that in a ceramic package whose chip mounting portion and leads are formed by a metallized layer on an insulator substrate.

In the IC package mentioned above, end portions of the respective leads, that is, inner end portions thereof, are positioned outside the chip mounting portion. Therefore, the package size is increased correspondingly. Further, since the inner end portions of the lead fingers on which the wires are bonded constitute root portions of the lead fingers after the chip is encapsulated by resin molding, and thus are required to withstand stress applied thereto. To this end, the respective inner end portions have marginal parts in a plane of the chip, each being wide enough to absorb such stress. Such marginal parts would prevent miniaturization of IC package. Although increase of package size caused by such marginal parts may be not considerable for an IC whose chip area is small, an increase of chip area and an increase of the number of terminals caused by increase of integration density would increase the package size considerably, further preventing miniaturization of a device including such ICs.

In order to solve this problem, IBM corporation announced, in 1988, an IC package (A-wire package) called "area wire bond" for 1 Mbit DRAM. (This package is disclosed in detail in U.S. Pat. No. 4,862,245 issued on Aug. 29, 1989 and further in, "Volume Production of Unique Plastic Surface-Mount Modules for the IBM 80-ns 1-Mbit DRAM Chip by Area Wire Bond Techniques", Proceedings of the 38th Electronic Component Conference, XIII-4, May, 1988, pp. 552–557).

This A-wire package is featured in that chip terminals on a rectangular memory chip are arranged in a longitudinal center portion of the chip and further in peripheral portions along short sides thereof, contrary to the conventional arrangement in which chip terminals are arranged on peripheral portions along the long sides. Further in this package, the chip mounting portion which would be required in the conventional package is removed, and the leads are arranged on the chip surface through an insulating film such that inner end portions of the respective leads are positioned inside a rectangular periphery of the chip. Since, in such A-wire package, connections between the chip terminals and the inner end portions of the lead fingers using the thin metal wires are formed in a plane which is in parallel to the chip and has a smaller area than that of the chip itself, the size of the package is made small to be substantially the same as that of the rectangular chip and therefore there is no protrusion of root portions of the lead fingers from the peripheral portion of the chip, that is, there is no protrusion of the inner end portions for wire bonding and stress absorbing margin, etc. Further, since the connections between the chip terminals and the inner end portions of the leads are fixedly formed on a surface of an insulating film of such as polyimide resin covering the surface of the chip, absorption of stress exerted from the outer end portions of the leads can be achieved easily. Further, since it is possible to reduce distance between the chip terminals and the inner end portions of the lead fingers, an amount of thin gold wires necessary to connect them can be saved.

However, in the A-wire package, a pair of busbars are required to be formed in positions corresponding to the arrangement of the chip terminals in the longitudinal center portion of the rectangular chip and inside the inner end portions of the lead fingers of the lead frame, the busbars being used to supply a source voltage and a ground potential to predetermined chip terminals through the thin gold wires. Therefore, the bonding wires, which connect some chip terminals for signal sources other than the voltage source and the ground potential source to the corresponding inner end portions of the leads are required to overarch the busbars. The thin gold wires overarching the busbars may be deformed during a pressure injection of resin material in a mold step for package formation, resulting in short-circuit with the busbars. Further, such overarching gold wires may increase thickness of the package.

BRIEF SUMMARY OF THE INVENTION

(1) Object of the Invention

Therefore, an object of the present invention is to provide an IC package in which connection between chip terminals and inner end portions of leads through bonding wires is simplified such that the IC package is further thinned while avoiding any undesired short-circuit.

(2) Summary of the Invention

According to the present invention, a semiconductor IC package comprises a rectangular semiconductor chip having a plurality of circuit elements formed thereon and a plurality of chip terminals for the circuit elements, an insulating film covering the main surface of the semiconductor chip except portions on which the chip terminals are formed, a plurality of leads provided on the insulating film and extending outside the semiconductor chip externally, and bonding wires connecting the chip terminals and inner end portions of the leads, respectively, wherein the chip terminals are arranged linearly along one side of the chip and the inner end portions of the lead fingers are arranged inside the arrangement of the chip terminals with respect to the one side of the chip.

Thus, the semiconductor IC package according to the present invention has no busbars between the lead fingers and the chip terminals and therefore it is possible to substantially shorten the bonding wires connecting them. Therefore, the possibility of breakage of the metal wires and/or short-circuit of the metal wires to other conductors due to pressure injection molding with resin material in a manufacturing process of the IC chip can be removed. Further, the thickness of the IC package can be reduced by the shortened metal wires. In addition, the above-mentioned structure of the IC chip can withstand stress exerted on the root portions of the inner end portions of the lead fingers.

BRIEF DESCRIPTION OF THE DRAWINGS

The above-mentioned and other objects, features and advantages of the present invention will become more apparent by reference to the following detailed description taken in conjunction with the drawings, wherein.

DETAILED DESCRIPTION OF PREFERRED EMBODIMENTS

Figure 1:
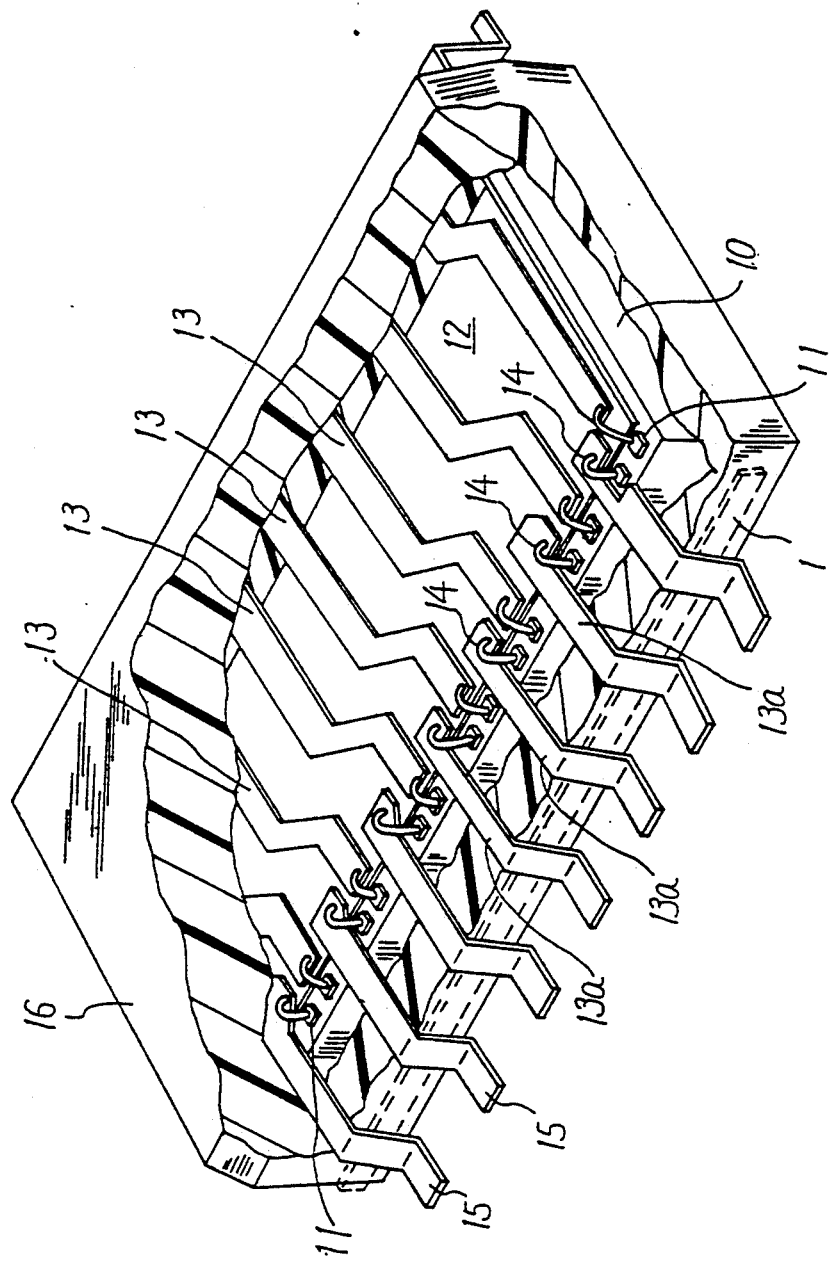
FIG. 1 is a partially cut-away, perspective view of an embodiment of the present invention.

Referring now to shown in FIG. 1, a rectangular semiconductor chip 10 according to an embodiment of the present invention has a plurality of chip terminals 11 arranged linearly along one of longer sides thereof. A main surface of the chip 10 except a portion thereof on which the chip terminals 11 are formed is covered by an insulating film 12 on which a plurality of leads 13 and 13a extending perpendicularly to the longer sides of the chip are arranged. I The leads 13 and 13a are practically formed as a portion of a lead frame although they are shown schematically. Inner end portions of the respective lead fingers 13 and 13a are arranged in an area of the insulating sheet 12 in which the chip terminals 11 are arranged, and connected to the chip terminals 11 by bonding wires 14, respectively. Outer end portions of the lead fingers 13 and 13a extend to a terminal portion 15 through downward and outward bent portions accommodating to a surface mounting of the IC package onto a printed circuit board (not shown).

After bonding, the assembly is air-tightly sealed by a resin layer 16, resulting in an IC package. The lead fingers 13 and 13a are integral by tie-bars 17, respectively, and are separated by removing the tie-bars 17 immediately before the sealing step.

Figure 2:
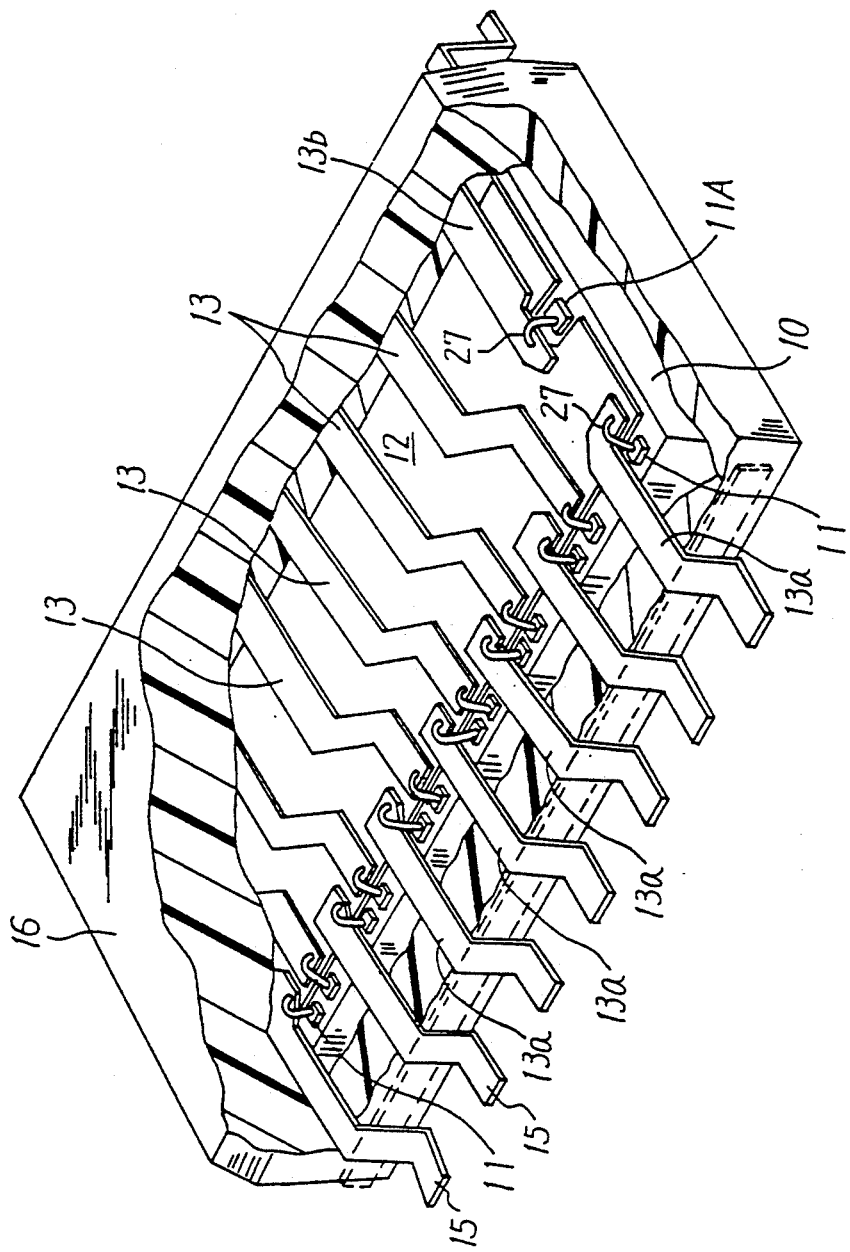
FIG. 2 is a partially cut-away, perspective view of a modification of the embodiment shown in FIG. 1.

Referring to FIG. 2 which shows a modification of the embodiment shown in FIG. 1 and in which common constitutional elements to those of the embodiment shown in FIG. 1 are depicted by the same reference numerals, respectively, a portion of the chip terminals, that is, a chip terminal 11A is arranged in the vicinity of not the long side of the chip 10 but a short side thereof. An inner end portion of a portion of the lead fingers 13, that is, a lead finger 13b is arranged in the vicinity of the chip terminal 11A, correspondingly. Although only one chip terminal 11A is shown for simplicity of illustration, the number of the chip terminals 11A may be increased when the number of the chip terminals 11 is increased according to the integration density of internal circuits of the chip 10 required, so that distance between adjacent chip terminals can be maintained optimum. The number of the lead fingers 13b is also changeable suitably according to the number of the terminals 11A.

As described, the IC package structure according to the present invention is suitable for miniaturization of package size and suitable to obtain a desired mechanical strength of the portion for mounting the lead fingers. Further, due to the shortened metal wires, the possibility of short-circuit and/or breakage of them is substantially reduced, resulting in an improved reliability of the IC package.

Although the present invention has been described with reference to specific embodiments, this description is not intended to restrict the scope of the present invention. It is contemplated that the true scope of the present invention shall be defined by the appended claims.

What is claimed is:

1. A semiconductor device comprising a semiconductor chip having first and second sides parallel to each other, a plurality of bonding terminals arranged in line along said first side, an insulating film covering said semiconductor chip without covering said bonding terminals, a plurality of first leads provided correspondingly to first ones of said bonding terminals, a plurality of second leads provided correspondingly to remaining second ones of said bonding terminals, each of said first leads having an inner end portion provided on said insulating film such that a corresponding one of said first ones of said bonding terminals exists between said inner end portion and said first side of said semiconductor chip and a remaining portion extended from said inner end portion to an outside of said semiconductor chip with passing over said first side of said semiconductor chip, each of said second leads having an inner end portion provided on said insulating film adjacently to a corresponding one of said second ones of said bonding terminals and a remaining portion extended from said inner end portion to an outside of said semiconductor chip with passing over said second side of said semiconductor chip, a plurality of first bonding wires each connecting each of said first ones of said bonding terminals to said inner end portion of a corresponding one of said first leads, and a plurality of second bonding wires each connecting each of said second ones of said bonding terminals to said inner end portion of a corresponding one of said second leads.

2. A semiconductor device as recited in claim 1, wherein said chip terminal and said corresponding lead finger are arranged on the short side of said rectangular semiconductor chip.

3. A semiconductor device as recited in claim 1, wherein the number of said chip terminals and said corresponding lead fingers is increased according to the required integration density of the internal circuits of said semiconductor chip.

4. A semiconductor device as recited in claim 1, wherein the distance between the adjacent chip terminals and the corresponding adjacent lead fingers is optimally maintained according to the required integration density of the internal circuits of said semiconductor chip.

5. A semiconductor device as recited in claim 2, wherein the number of said chip terminals and said corresponding lead fingers is increased according to the required integration density of the internal circuits of said semiconductor chip.

6. A semiconductor device as recited in claim 2, wherein the distance between the adjacent chip terminals and the corresponding adjacent lead fingers is optimally maintained according to the required integration density of the internal circuits of said semiconductor chip.

* * * * *

UNITED STATES PATENT AND TRADEMARK OFFICE
CERTIFICATE OF CORRECTION

PATENT NO. : 5,327,009
DATED : July 5, 1994
INVENTOR(S) : Masahiko Igeta

It is certified that error appears in the above-indentified patent and that said Letters Patent is hereby corrected as shown below:

Column 3, line 37, delete "I".

Signed and Sealed this

Twenty-seventh Day of September, 1994

Attest:

BRUCE LEHMAN

Attesting Officer

Commissioner of Patents and Trademarks